LOW INSERTION LOSS UNILATERALIZATION STRUCTURE

Filed Feb. 15, 1961

WITNESSES

Leon J. Laza
James F. Young

INVENTORS
Irving F. Barditch, Robert Bento
and William Freeman
BY Maury I. Hull
ATTORNEY

United States Patent Office 3,204,192
Patented Aug. 31, 1965

3,204,192
LOW INSERTION LOSS UNILATERALIZATION STRUCTURE

Irving F. Barditch, Baltimore, Md., Robert Bento, Tiverton, R.I., and William Freeman, Baltimore, Md., assignors to Westinghouse Electric Corporation, East Pittsburgh, Pa., a corporation of Pennsylvania Filed Feb. 15, 1961, Ser. No. 89,499
4 Claims. (Cl. 330—27)

This invention relates to improvements in unilateralization devices for electric circuits employing semiconductors, and more particularly to an improved unilateralization device or structure which is characterized by a low insertion loss.

One of the serious problems in the application of tuned monolithic semiconductor amplifiers is obtaining the unilateral flow of signals. This unilateral flow is required, since bidirectional signal flow will result in instability, oscillation and interstage frequency pulling. As will be understood by those skilled in the art, current structures such as transistors and other semiconductor devices are bilateral in nature and must be unilateralized.

The apparatus or circuit of the instant invention provides for unilateralization by providing a frequency selective feedback loop equivalent to a tuned amplifier circuit, in which a signal to be transmitted or rejected is shifted in phase by a first element substantially 180° and thereafter shifted in phase by another element substantially an additional 180° and applied as a feedback signal to the input signal point. Such a tuned amplifier is described and claimed in a copending application by Barditch and Fogle entitled "Delay Cable Tuned Semiconductor Amplifier Suitable for Partial Molecularization," Serial No. 80,877, filed January 5, 1961, and assigned to the assignee of the invention presently under consideration. In the instant invention, an output terminal is connected by way of an isolating transistor to some point in the feedback loop. Signals leaking back from the output terminal through the isolating transistor arrive at the circuit point in a signal phase which is not built up by the frequency selective feedback loop, and hence are attenuated and do not appear in any substantial amplitude at the input of the unilateralization circuit.

In one embodiment of the subject invention, the feedback signal is positive or regenerative, and is designed to compensate for losses which might occur in the device. An output is taken from a circuit point midway between the first phase shifting and the second phase shifting elements, and is applied by way of the coupling or isolating transistor to an output load. The coupling transistor may be referred to as a unilateral transistor, that is, as isolating the output; any output signal which tended to leak back through the unilateral transistor would arrive at the amplifier circuit at a point where it would be in phase opposition and would not be passed to the input circuit in a manner to further leak back into the source supplying the input signal to be amplified.

The invention is suitable for at least partial molecularization in monolithic form.

A primary object of the invention accordingly is to provide a new and improved unilateralization structure for semiconductor circuits.

A further object is to provide a new and improved low insertion loss unilateralization structure for electrical circuits employing semiconductor and transistor devices.

These and other objects will become more clearly apparent after a study of the following specification, when read in connection with the accompanying drawings, in which.

Figure 1:
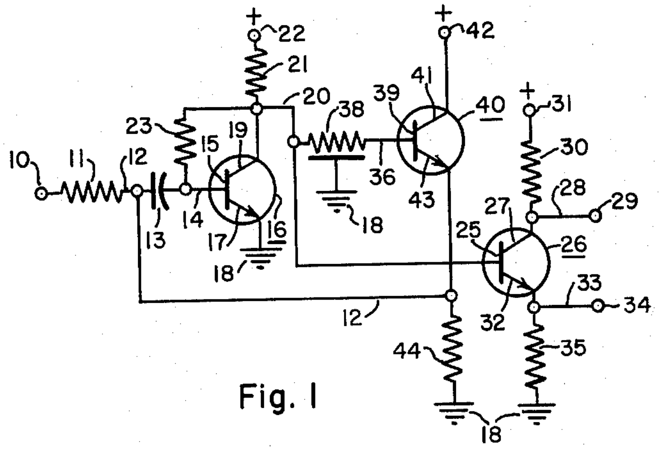
FIGURE 1 is a circuit diagram of an equivalent transistorized version of apparatus according to the preferred embodiment of the invention.

Referring now to the drawings, in which like reference characters are used throughout to designate like parts, for a more detailed understanding of the invention, and in particular to FIG. 1 thereof, there is shown at 10 an input terminal to which the signal to be passed or unilateralized is applied. Terminal 10 may be an ohmic connection on a block of semiconductor material. The terminal 10 is connected by way of resistor 11, which may be a suitably doped region or channel in the semiconductor block, lead 12, which may be a highly doped channel in the semiconductor block, capacitor 13, and lead 14 to the base 15 of a transistor portion 16. The capacitor 13 may be formed inside the semiconductor block by two doped layers separated by an intrinsic layer, or by a reverse-biased junction, any suitable biasing means, not shown, being employed. The emitter 17 of transistor 16 is connected to ground 18. The collector 19 is connected by way of lead portion 20 and resistor portion 21 to a terminal 22 of a source of direct current energizing potential, not shown, having the other terminal thereof connected to ground 18. Lead portion 20 is further connected by way of resistor portion 23 to the aforementioned lead 14, resistor 23 providing for the application of a potential to base portion 15 so that the base is properly biased with respect to the collector and emitter of the transistor section 16.

Lead 20 is also connected to the base 25 of a unilateral transistor generally designated 26 having the collector 27 connected by way of lead portion 28 to one output terminal 29, and also connected by way of resistor portion 30 to a terminal 31 which has connected thereto a suitable source of direct current energizing potential, not shown, having the other terminal thereof connected to ground 18. The emitter 32 of transistor section 26 is connected by way of lead 33 to alternate output terminal 34, and lead 33 is also connected by way of resistor 35 to ground 18.

The aforementioned lead 20 is also connected by way of a phase shift device generally designated 38 and lead 36 to the base 39 of an additional transistor 40 which is connected as an emitter follower and has the collector 41 thereof connected to terminal 42 which is connected to a suitable source of direct current energizing potential, not shown, having the other terminal thereof connected to ground 18. The emitter 43 of transistor 40 is connected to aforementioned lead portion 12, which is also connected by way of resistor 44 to ground 18.

Figure 2:
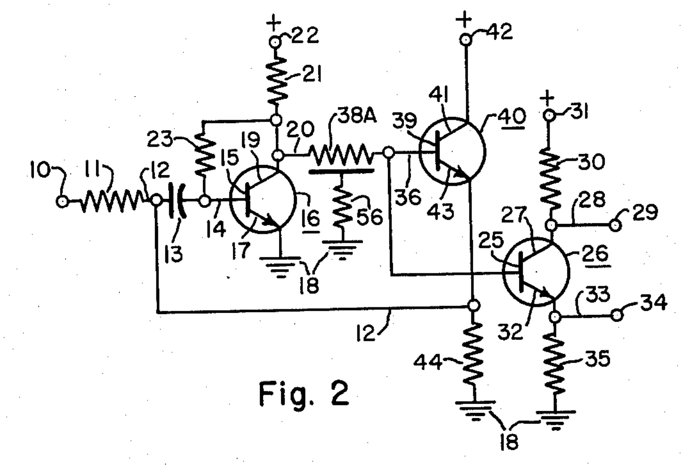
FIG. 2 is an equivalent transistorized electrical circuit diagram according to a second embodiment of the invention.

The phase shift device 38 may be a frequency selective delay line to provide a phase delay corresponding to a shift of 180 degrees for signals of the frequency to be amplified, or device 38 may be a semiconductor device 38A as in FIG. 2 including a reverse biased p-n junction with a resistor 56 in the grounding leg thereof, similar to that described and claimed in a copending application of W. M. Kaufman entitled "Narrow Band Rejection Filter and Tunable Monolith for Use Therein," Serial No. 5,045, filed January 27, 1960, and assigned to the assignee of the instant invention. Other embodiments in the copending application may also be used at 38A. The use of distributed capacity semiconductor devices including reverse biased p-n junctions in conjunction with distributed resistance to provide the equivalent of filter circuits with predetermined phase shift characteristics has been described in the literature of the art. Reference may be had to an article by C. K. Hager, entitled "Distributed Parameter Networks for Circuit Miniaturization" appearing in the Proceedings of the Joint Electronic Components Conference, I.R.E., A.I.E.E., May 1959.

Figure 3:
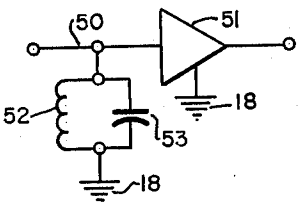
FIG. 3 is a circuit diagram helpful in describing the operation of the apparatus of FIGS. 1 and 2.

Particular reference is made now to FIGURE 3. Assume, for example, that a signal to be amplified is applied to lead 50 and thence to amplifier 51, and that a parallel resonant circuit comprising inductor 52 and capacitor 53 is connected from lead 50 to ground 18. Signals on lead 50 of a frequency corresponding to the resonant frequency of circuit 52–53 will "look into" an exceedingly high impedance from lead 50 to ground, depending upon the Q of the resonant circuit, and will suffer substantially no attenuation, whereas signals which differ substantially from the resonant frequency may be sharply attenuated because the L-C circuit 52–53 offers a small impedance to signals of frequencies other than the resonant frequency. An effect similar to that described in connection with FIGURE 3 is provided for in FIGURE 1, when device 38 is a frequency selective delay line having appropriate characteristics. The feedback of signal energy is highly frequency selective. A signal of a suitable frequency applied to input terminal 10 is amplified and has the phase thereof shifted 180° in the transistor portion 16. This signal is thereafter shifted an additional 180° in phase by the device 38 and is thereafter applied through the emitter follower transistor 40 without substantial further phase alteration, by way of lead 12 to the input of transistor 16, being of a phase to provide positive feedback, but being of insufficient amplitude to cause instability and oscillation in the circuit. This effectively builds up the desired signal, as a tuned amplifier would do. The signal on lead 20, which is connected as shown to the collector 19 of transistor 16, is also applied to base 25 of transistor 26, and after passing through the transistor 26 is delivered to an output terminal, which may be selectively one of the output terminals 29 and 34. It will be seen that the signal on lead 20 is 180° out of phase with the signal on terminal 10. Accordingly, a signal at one of the output terminals 29 or 34 which leaks back through the transistor 26 to lead 20 is applied at a circuit point where after a shift in phase by device 38, it is not of a character to be fed back as positive feedback to the input circuit connected to terminal 10, so that in effect the circuit provides isolation between any output load connected at terminal 29 or 34 and an input source connected to the aforementioned input terminal 10. The circuit may be thought of as offering a low impedance to ground to signals which leak back through transistor 26, or a high series impedance to these signals.

Particular reference is made now to FIGURE 2. FIG. 2 is seen to be somewhat similar to FIG. 1 except that the phase shift device 38A has a resistor 56 in the grounding lead thereof providing a notch filter, and the base 25 of the unilateral transistor 26 is connected to lead 36 which couples the output of the phase shift device 38A to the emitter follower transistor 40. As previously stated, the circuit may operate either as a degenerative or regenerative feedback circuit. The device 38A with the resistor 56 provides for frequency rejection, as explained in the aforementioned copending application by W. M. Kaufman, and accordingly the feedback may be degenerative. As before, signals leaking back through transistor 26 to lead 36 are not amplified or built up in the feedback loop because of its phase shift and/or frequency response characteristics.

The transistor portions 16, 26 and 40 may be suitably doped regions in a single semiconductor block containing the resistive, capacitative, terminal and lead portions.

The invention includes other modifications, for example the resistor 56 could be added to the phase shift device of FIGURE 1. Likewise, the base 25 of transistor 26 in FIGURE 1 could if desired be connected to lead 36 which couples the output of the phase shift device 38 to the base 39 of emitter follower transistor 40.

One of the output terminals 29 or 34 may be dispensed with if desired.

It will be understood that, in the claims appended hereto, the terms "transistor," "resistor," "capacitor," "lead," etc. may refer to suitable portions of a single semiconductor block, where donor or acceptor impurities in desired concentrations exist to provide the desired electrical characteristics.

Whereas the invention has been shown and described with respect to some embodiments thereof which give satisfactory results, it should be understood that changes can be made and equivalents substituted without departing from the spirit and scope of the invention.

We claim as our invention:

1. A unilateralization device comprising, in combination, input circuit means including a ground terminal, first transistor means connected as a grounded emitter operatively connected to the input circuit means for amplifying a signal applied to the input circuit means and shifting the phase of said signal substantially 180°, second transistor means connected as an emitter follower and having the emitter thereof connected to the input circuit means, other circuit means including phase shift means operatively connecting the output of the first transistor means to the input of the second transistor means, and third transistor means constituting an output isolation device, said third transistor means being operatively connected to said other circuit means whereby signals leaking through the third transistor means in a reverse direction are effectively offered a low impedance to ground and are thereby attenuated and do not appear in any substantial amplitude in said input circuit means.

2. A signal translation device for passing a signal without substantial attenuation in one direction while attenuating signals passing in the other direction, comprising input circuit means including a ground terminal, a first transistor operatively connected to the input circuit means for amplifying a signal applied to the input circuit means and shifting the phase of the signal 180°, a frequency selective phase shift device, other circuit means connecting the output of the first transistor to the input of the phase shift device, a second transistor connected as an emitter follower and having the emitter thereof operatively connected to the input circuit means, further circuit means connecting the output of the phase shift device to the input of the second transistor, and a third transistor operatively connected to the other circuit means, the output of the signal translation device being taken from the third transistor, the phase shift in the first transistor and the phase shift device for selected frequencies totaling 360° whereby regenerative feedback for the selected frequencies is supplied to the input and a low impedance path to ground is provided for other frequencies in the output circuit.

3. A signal translation system comprising input circuit means, a first transistor means operatively connected to said input circuit means for amplifying input signals applied to said input circuit means and for shifting the phase thereof 180°, a second transistor means connected as an emitter follower, a frequency selective phase shifting device having its input operatively connected to the output circuit of said first transistor means and having its output connected to said second transistor means, a third transistor means, circuit means connecting the output of said first transistor to the input of said third transistor, said third transistor means having output circuit means, and further circuit means connecting the emitter of said second transistor means to the input circuit means whereby said phase shifting device and said second transistor means provide a regenerative feedback signal to said input circuit means for a preselected frequency band and provide a degenerative feedback to said input circuit means for frequencies outside of said selected frequency band.

4. A signal translation system comprising input circuit means, first transistor means operatively connected to said input circuit means and connected as a grounded emitter, second transistor means connected as an emitter follower, frequency selective phase-shifting means connected in a circuit between the output of said first transistor means and the input of said second transistor means, feedback circuit means connecting the emitter of said second transistor means and said input circuit means, unilateral output signal translation means having its input connected to the circuit between said first and second transistor means, whereby regenerative feedback for a selected band of frequencies is supplied to said input means, degenerative feedback is supplied for other frequencies and a low impedance path to ground is provided for said other frequencies in the output circuit.

References Cited by the Examiner

UNITED STATES PATENTS

| | | | |
|---|---|---|---|
| 2,617,930 | 11/52 | Cutler | 328—63 |
| 2,936,424 | 5/60 | Steggerda | 330—21 |
| 2,958,825 | 11/60 | Diehl et al. | 328—63 X |

OTHER REFERENCES

Helward et al.: Article, Science, vol. 132, Oct. 21, 1960, Integration of Circuit Functions Into Solids, pages 1127–1133.

Wallmark et al.. Article, RCA Engineer, vol. 5, No. 1, June-July 1959, Integrated Semiconductor Devices, pages 42–45.

ROY LAKE, *Primary Examiner.*

RUDOLPH V. ROLINEC, NATHAN KAUFMAN, *Examiners.*